(12) United States Patent
Taddei et al.

(10) Patent No.: US 11,756,805 B2
(45) Date of Patent: Sep. 12, 2023

(54) APPARATUS AND METHOD FOR DIE STACK FLUX REMOVAL

(71) Applicant: Veeco Instruments Inc., Plainview, NY (US)

(72) Inventors: John Taddei, Jim Thorpe, PA (US); Kenji Nulman, Horsham, PA (US); Jonathan Fijal, Conshohocken, PA (US); Phillip Tyler, Horsham, PA (US); Ian Rafter, Ambler, PA (US)

(73) Assignee: VEECO INSTRUMENTS INC., Plainview, NY (US)

( * ) Notice: Subject to any disclaimer, the term of this patent is extended or adjusted under 35 U.S.C. 154(b) by 230 days.

(21) Appl. No.: 17/117,762

(22) Filed: Dec. 10, 2020

(65) Prior Publication Data

US 2021/0202272 A1 Jul. 1, 2021

Related U.S. Application Data

(60) Provisional application No. 62/954,136, filed on Dec. 27, 2019.

(51) Int. Cl.
| | |
|---|---|
| *H01L 21/67* | (2006.01) |
| *B23K 1/20* | (2006.01) |
| *B08B 3/04* | (2006.01) |
| *B08B 3/02* | (2006.01) |
| *H01L 21/02* | (2006.01) |
| *B08B 5/02* | (2006.01) |

(52) U.S. Cl.
CPC ........ *H01L 21/67051* (2013.01); *B08B 3/024* (2013.01); *B08B 3/04* (2013.01); *B23K 1/206* (2013.01); *B08B 5/02* (2013.01); *H01L 21/02334* (2013.01); *H01L 21/67057* (2013.01)

(58) Field of Classification Search
CPC .. B08B 5/02; B08B 3/04; B08B 3/024; H01L 21/67057; H01L 21/67051; H01L 21/02334; B23K 1/206
See application file for complete search history.

(56) References Cited

U.S. PATENT DOCUMENTS

| | | | |
|---|---|---|---|
| 2004/0031503 A1* | 2/2004 | Eitoku | B08B 3/02 134/28 |
| 2004/0089325 A1* | 5/2004 | Park | B08B 3/02 134/94.1 |
| 2012/0216840 A1* | 8/2012 | Nishigaki | H01L 24/75 134/198 |
| 2013/0056033 A1* | 3/2013 | Matsui | H01L 21/67028 134/198 |
| 2015/0147888 A1 | 5/2015 | Nonaka et al. | |
| 2016/0044795 A1* | 2/2016 | Taniguro | B23K 3/087 228/19 |
| 2017/0330770 A1* | 11/2017 | Kim | B08B 1/04 |
| 2019/0131145 A1 | 5/2019 | Tai et al. | |

FOREIGN PATENT DOCUMENTS

| | | |
|---|---|---|
| TW | I67789 | 10/2019 |
| WO | WO 2019/246245 | 12/2019 |

* cited by examiner

*Primary Examiner* — Benjamin L Osterhout
(74) *Attorney, Agent, or Firm* — Leason Ellis LLP

(57) ABSTRACT

A system for removing flux from openings formed in a substrate that has openings (e.g., sized 20 microns or less) formed therein includes a spay nozzle device that has a spray nozzle arm that is formed at an angle of about 45 degrees or less for discharging fluid towards the openings in the substrate for flux removal. The angle is between about 30 degrees and 45 degrees.

20 Claims, 4 Drawing Sheets

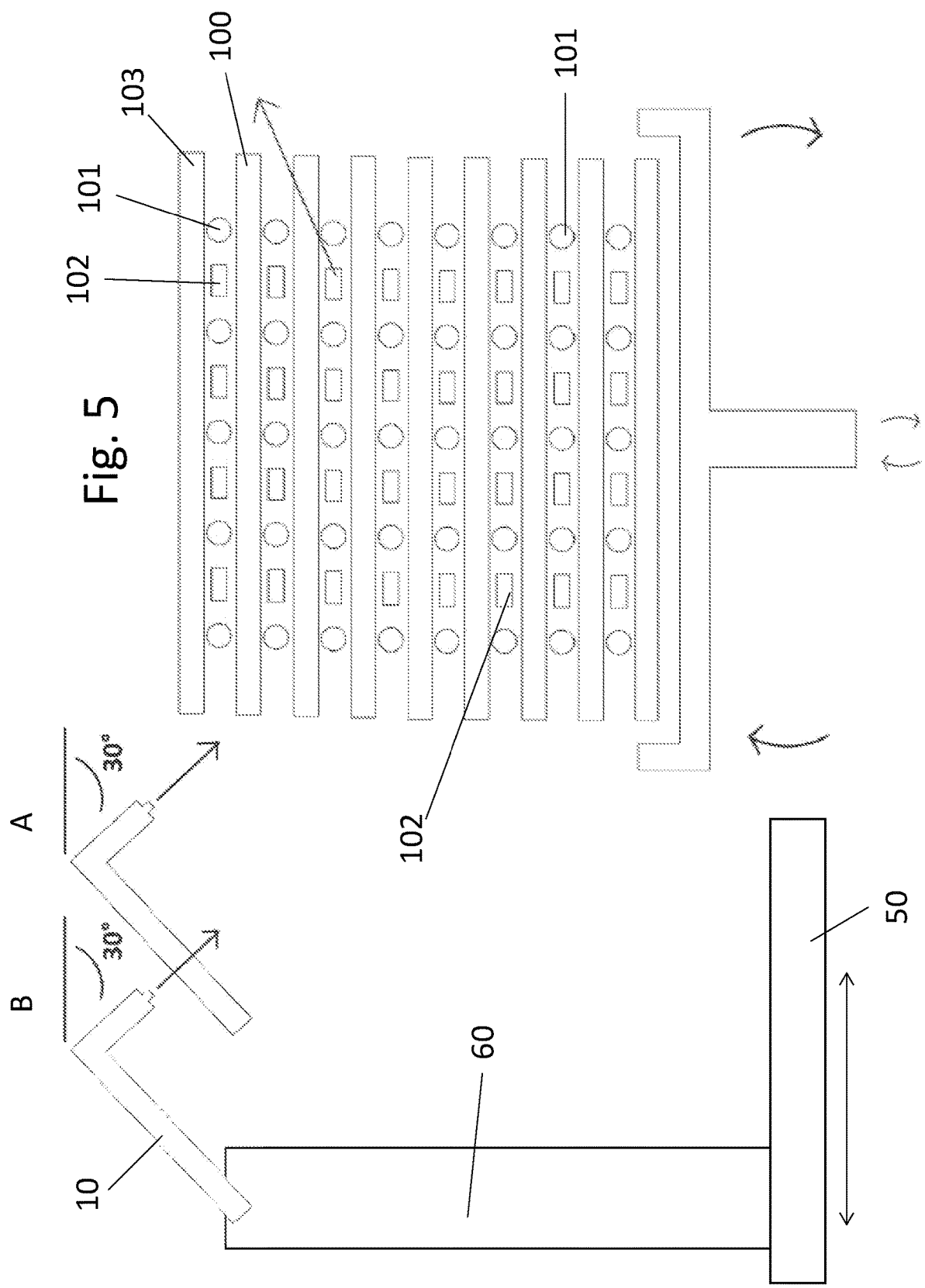

APPARATUS AND METHOD FOR DIE STACK FLUX REMOVAL

CROSS REFERENCE TO RELATED APPLICATION

The present application claims the benefit of and priority to U.S. patent application Ser. No. 62/954,136, filed Dec. 27, 2019, which is hereby incorporated by reference in its entirety.

TECHNICAL FIELD

This invention generally relates to an apparatus and method for removal of flux and flux residues. More specifically, this invention relates to an apparatus and method for removing flux from a device bonded to other devices or substrates.

BACKGROUND

Trends in semiconductor manufacturing and related processing have turned to 3D architecture to improve performance. In this style devices are mounted and bonded to other devices one on top of the other. A number of technologies are employed to bond contacts, including solder bumps and pillars. These bonding processes can use flux and require a flux and flux residue removal process when the bond is completed. Devices are continuously reduced in size, as are the bumps that connect the devices. The bumps have trended down from 100+ microns in years past to 10-20 microns or less in recent years. This has been further complicated with semiconductor design turning to 3D architecture (by definition means devices are stacked). Because of these factors direct access (especially in vertical orientation) is reduced\eliminated. In many instances openings available to permit flux removal fluids to contact those area with flux are less than 20 microns. Simply spraying flux removal chemistry downward on a substrate will only contact the top of uppermost devices and openings for fluid do not exist in this orientation. Immersing the substrate in a fluid bath with tradition flux removal solvents will not get solvent to the bond areas and remove the flux, as the surface tension of many flux removal fluids will not penetrate the small openings. Similarly, even if some flux removal fluid can penetrate the opening getting sufficient quantities of rinsing fluid in to carry out and flux removal chemistry and flux residues will have identical issues with fluid penetration through the small openings. Post rinse any fluids are trapped within the device structure are difficult to remove. These fluids tend to be left behind and redeposit flux, flux residues and other contamination when they evaporate and reduce yield.

SUMMARY

In one embodiment, an apparatus and method are disclosed to remove flux and flux residues from 3D packaging, such as die stack and chip on wafer technologies. Step one is to get flux removal fluid (chemistry) through the small openings that can be 20 microns or less (See, FIG. 2). The opening for flux removal fluid to enter is very small and high fluid surface tension inhibits fluid entrance through the opening. Head pressure from immersion of the substrate to a sufficient depth in low surface tension fluid will permit fluid to pass through the openings. As shown in FIG. 1, the substrate will stay within an immersion bath 25 for a period of time where agitation, ultrasonic energy and\or fluid recirculation through the bath will assist in fluid flow through device openings.

The substrate will then be transferred wet to a spin station 35 (second step) to complete the flux removal portion of the process. A combination of high-pressure and low-pressure flux removal fluid will be used further force fluid movement through the small openings. It should be noted this may or may not be the same fluid as in the immersion station. High pressure spray in a downward orientation is ineffective as described below with reference to FIG. 3. High pressure (up to 3,000 psi) or high velocity spray nozzles are oriented in a low angle (0 to <45 degree) spray orientation to direct spray at the openings as shown in FIG. 2. An arm scan across the substrate from edge to edge and by reversing spin direction provides superior fluid flow through the areas to remove the flux. This spray may be done at a number of pressure settings, and potentially while changing substrate RPM. Cycling spin chuck RPM and using low pressure, high volume dispenses assist in flowing flux removal chemistry through the device openings in order to remove dirty and saturated flux removal chemistry. Rinsing is accomplished through the use of low clean surface tension fluid to displace the flux removal fluid. The similar dispense type cycling (high pressure\high velocity at low angle and high volume/ low pressure) and chuck RPM cycling to entice sufficient fluid through the devices to displace as much flux removal fluid with low surface tension rinse fluid as possible.

The substrate in some cases will be transferred to an immersion station filled with the rinsing fluid 45. Agitation, ultrasonic energy and\or fluid recirculation can be used to entice fluid flow through package openings to remove any flux removal chemistry or other contaminants. All immersion stations (flux removal or rinse stations) have multi-substrate capability and it is process dependent if one or more substrates are in the station concurrently. Post rinse immersion the wafer returns to a spin station 55 (which can be the same station 25) to repeat high pressure\high velocity spray and low pressure dispense cycles of low surface tension rinse fluid, while varying RPM of the substrate. This RPM cycling is required to fully rinse out solvent and eliminate staining from solvents during dry. The substrate will then be spun dry. Spin dry can be done with the assistance of a nitrogen source (optionally heated). The nitrogen source needs to in oriented at the small openings between the die in order to maximize nitrogen flow between the die for drying. Optionally the substrate can be processed through a hot plate with nitrogen purge, generally indicated at 59 in FIG. 1, to ensure complete fluid removal. The hot plate is designed to heat the substrate and include integral nitrogen purge in which nitrogen gas is used.

In some embodiments, one or more of the stations 25, 35, 45, 55 can be combined into a single station.

BRIEF DESCRIPTION OF THE DRAWING FIGURES

FIG. 5 shows the optional linear movement of the high velocity spray nozzle device.

DETAILED DESCRIPTION OF CERTAIN EMBODIMENTS

Figure 2:
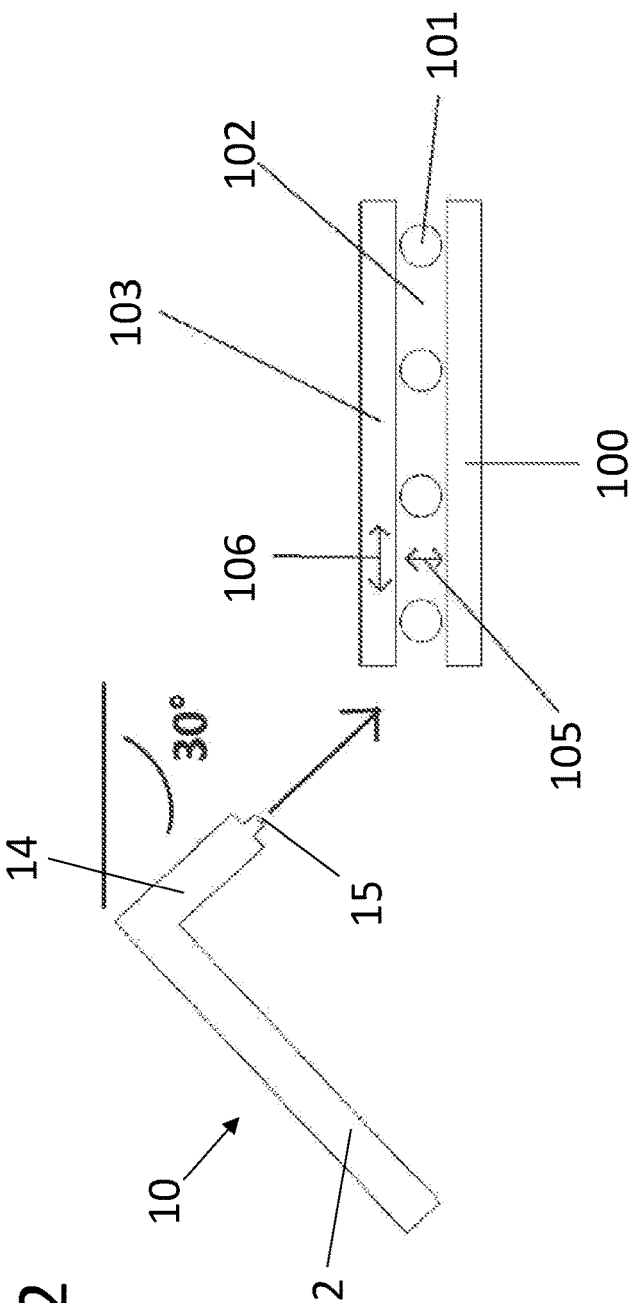
FIG. 2 is a cross-sectional view of a substrate with a die along with a high pressure or high velocity spray nozzle oriented at a prescribed angle relative to the die.

FIG. 2 is a cross-sectional view of a substrate defined by a first die (chip) 100 and a second die (chip) 103 that is spaced from the first die 100. In the illustrated embodiment, the second die 103 is the uppermost die, while the first die 100 is the lowermost die. Each die 100, 103 has interconnect devices 101 that can be in the form of pillars, solder bumps, metal pads, etc., and flux 102. As shown in the cross-sectional view of FIG. 2, there can be plural interconnect devices 101 that are spaced across the dies 100, 103 in spaced relationship. The flux 102 is shown as being located between the interconnect devices 101.

The substrate 100 also includes openings 105, 106 that are formed in the device and represent the locations where the flux 102 resides. These openings 105, 106 have small dimensions and can be on the order of about 20 microns.

Figure 1:
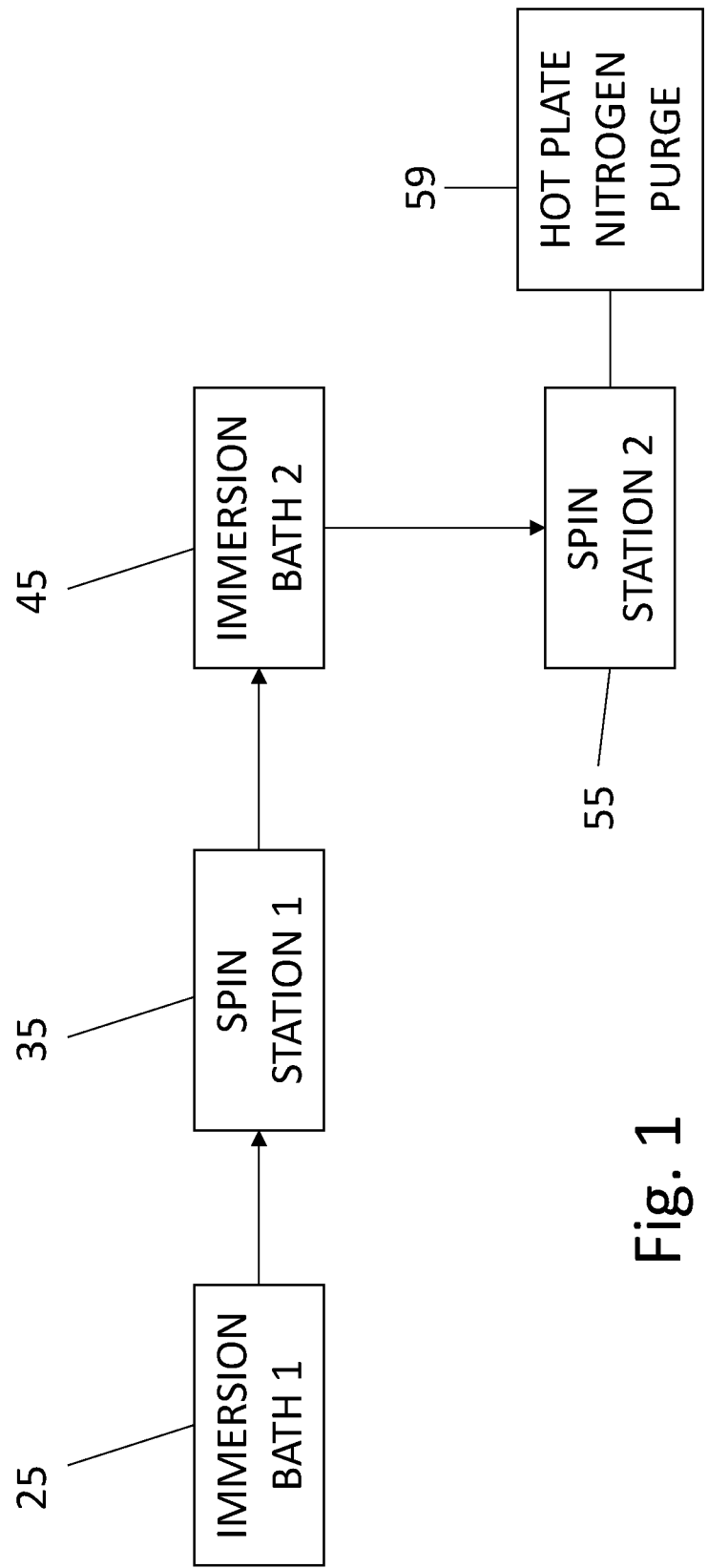
FIG. 1 is a schematic of a system in accordance with one embodiment.

As is known, in order to remove the flux 102, chemistry is applied to the flux 102 for removal thereof (in a spray chamber or the like, such as at spin station 35 of FIG. 1). The chemistry is applied to the substrate 100 using a tool or device that is typically in the form of a spray nozzle device 10. The spay nozzle device 10 is in fluid communication with the source of chemistry and is operatively coupled to a pump or the like to generate high pressure or high velocity spray. The spray nozzle device 10 has a first portion 12 that can be a main arm and a bent distal end portion 14 to which a nozzle 15 is attached.

In accordance with one embodiment, the chemistry that is used in the immersion bath and the fluid that is discharged through the spray nozzle device 10 can be selected from one of the following: Zestron FA+ (concentrated); Zestron Hydron (20:1 dilution with water); and hot DI water. It will also be appreciated that the fluid in the immersion bath and the fluid discharged through the spray nozzle device 10 can be the same fluid or can be different fluids. In general, these fluid can be commercially available die stack flux fluids that are suitable for the intended use.

Figure 3:
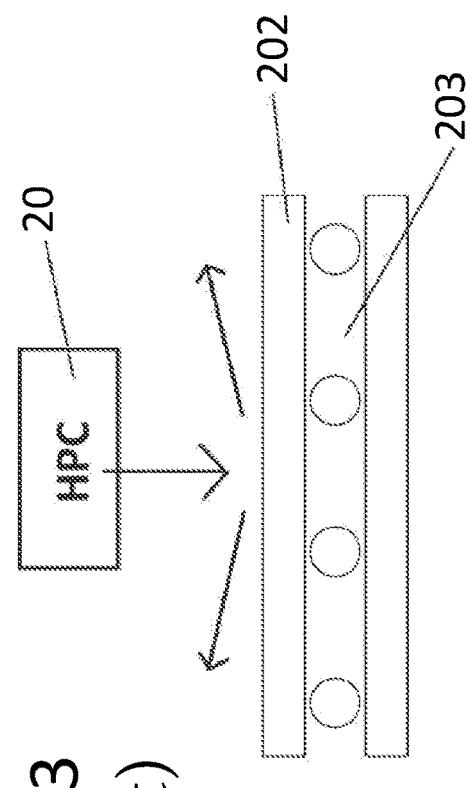
FIG. 3 is a cross-sectional view showing a conventional spray nozzle with a vertical or near vertical spray relative to a die.

In a traditional orientation, that is shown in FIG. 3, the spray nozzle device, generally shown at 20 in FIG. 3, generates a vertical or near vertical spray that simply contacts the uppermost die 202 of the conventional substrate shown in FIG. 3. Flux removal solvent from this spray pattern would not penetrate to between a lower die 203 in order to remove all the flux that is located between the two dies 202, 203. This results because the discharged chemistry is not directly sprayed into contact with the flux that is located between the two dies 202, 203 and instead deflects off as indicated by the arrows. In addition, rinse fluid in this orientation does not completely rinse the solvent and nitrogen to assist dry and therefore is ineffective in the near vertical plane. Either case would lead to defectivity and yield reduction. Any of these cases would lead to defectivity and yield reduction.

Referring back to FIG. 2, the spray nozzle device 10 is configured to overcome the deficiencies noted above with respect to the conventional spray nozzle device 20. In particular, the spray nozzle device 10, and in particular, the bent distal end portion 14 to which a nozzle 15 is attached, is specifically configured to discharge a spray that is angled advantageously to the flux 102 and the opening (between the dies). In one embodiment, the angle of the spay nozzle 10 is less than 45 degrees (e.g., between 30 degrees and 45 degrees) and more particularly, can be about 30 degrees as measured from a horizontal reference plane that is shown in FIG. 2 and is a plane that is parallel to a plane passing through a top of the uppermost die. In FIG. 2, the horizontal reference plane is shown by a line that contacts the uppermost end of the nozzle 10 and is parallel to the top surface of the uppermost die (and parallel to a ground surface). Applicant has discovered that this spray angle is advantageous for flux removal chemistry, rinsing fluid or nitrogen drying assist. Unlike the traditional spray pattern shown in FIG. 3, which is only directed to the exposed top surface of the substrate, the angled spray nozzle device shown in FIG. 2 discharges chemistry directly into the opening between the two dies and thus into direct contact with the flux 102, etc. In other words, the traditional spray pattern illustrated in FIG. 3 directs the spray at an angle that is normal (90 degrees) relative to the top surface of the substrate. It will be appreciated that at this angle, it is simply not possible to spray between two dies to spray the flux 102 directly.

The spray nozzle device 10 is configured to generate high pressure spray (up to 3,000 psi) or a high velocity spray that is discharged through one or more nozzles that are oriented in a low angle (0 to <45 degree) spray orientation to direct spray at the openings as shown in FIG. 2. This measurement is measured relative to a plane that is parallel to a horizontal plane containing the top surface of the substrate. In other words, the degree measurement (e.g., 30 degrees) is measured off a plane parallel to substrate orientation.

In one embodiment, the spray nozzle device 10 can have an adjustable nozzle head in that the angle of the spray nozzle device 10 can be adjusted between 0 degrees and 45 degrees relative to the horizontal reference plane of FIG. 2. The discharge arm of the spray nozzle device 10 can thus pivot relative to a main post or arm of the spray nozzle device 10 and can be locked in a selected chosen angle.

As described below, it will be appreciated that the spray nozzle device 10 moves in a direction toward and away from the substrate 10. As described with reference to FIG. 4, this movement of the spray nozzle device 10 allows the substrate location on which the chemistry is sprayed to be altered. This linear movement of the spray nozzle device 100 does not change the angle of the spray nozzle device which is fixed (e.g., 30 degrees in one embodiment). It will be appreciated that the spray nozzle device 10 can be part of a robotic system and therefore, the robotic arm movement can cause this movement of the spray nozzle device 10. In one embodiment, shown in FIG. 5, the spray nozzle device 10 can ride along a horizontal (linear) track 50 that allows the spray nozzle device 10 to be brought toward the die stack or moved away therefrom. The spray nozzle device 10 can be at the top of an upright post (upright support member) 60 that moves linearly along the track 50 to bring the spray nozzle device 10 closer to or further away from the die stack (as indicated by the arrow below the track 50). In yet another embodiment, the spray nozzle device 10 can include vertical movement in that the spray nozzle device can be raised and lowered relative to the die stack. Again, the angle of the spray nozzle device 10 is not altered.

In order to maximize fluid through the die stack, the substrate requires RPM cycling. Low RPM speeds are advantageous to permit the between die areas to become filled with fluid. High RPM steps use centrifugal force to assist in getting fluid from between die. The cycles assist in getting solvent in to dissolve the flux and then rinsing fluid to remove the solvent.

Figure 4:
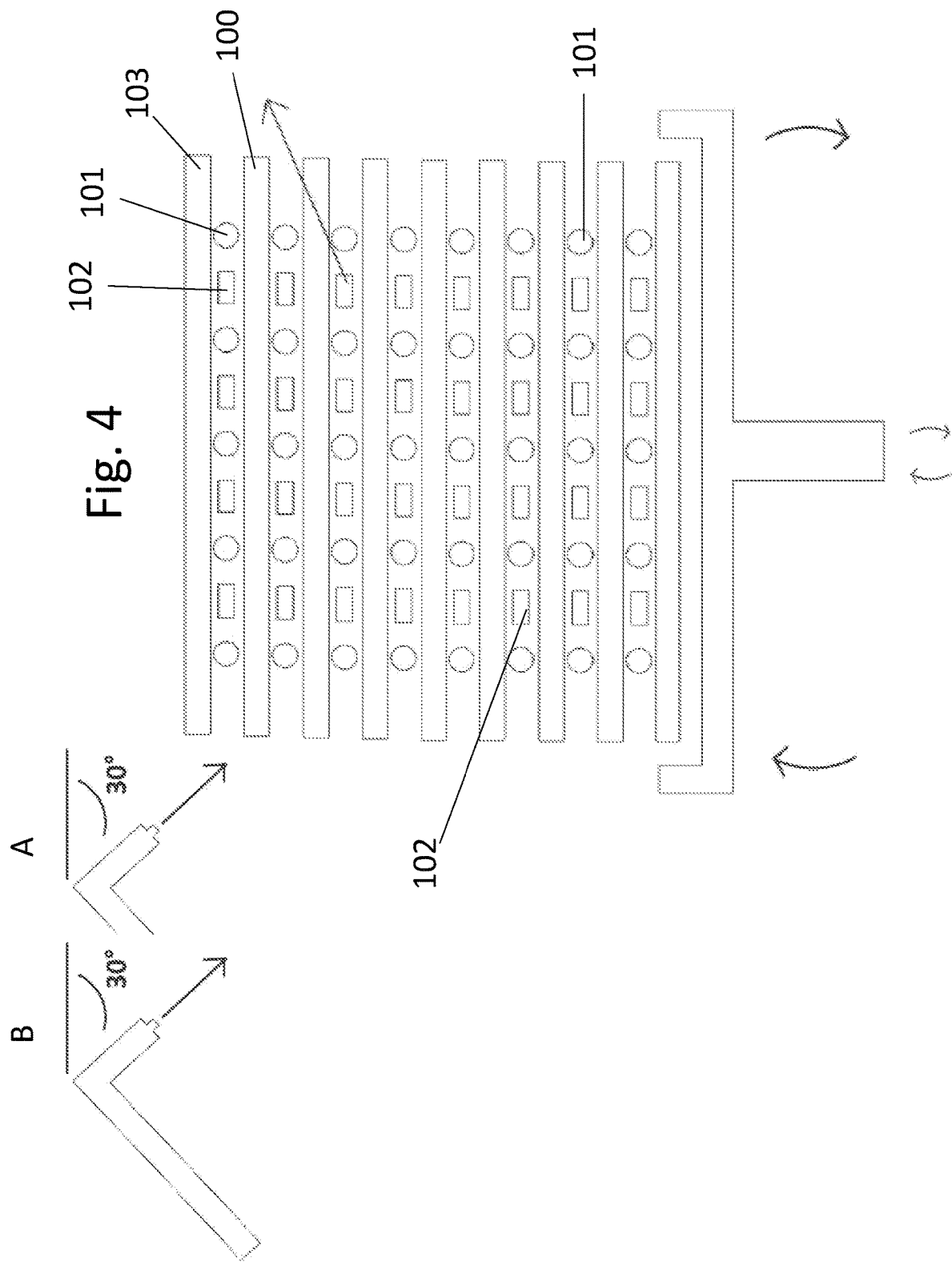
FIG. 4 is a cross-sectional view of an exemplary die stack comprising a plurality of stacked dies.

FIG. 4 illustrates a die stack that includes a plurality of die; however, it will be appreciated that the die stack can be formed of a single die or multiple die. Moreover, multiple die stacks can be 8 or 16 high (or higher) and contain a single die or multiple die types within the stack. As shown in FIG. 4, the entire stack has a plurality of dies that are stacked with interconnect devices 101 and flux 102 located between the dies. Thus, as discussed with reference to FIG. 2, in order to remove the flux 102 and properly treat the substrate, the chemistry discharged from the nozzle must be directed into the openings between pairs of dies. The die stack is vertically oriented and therefore, the chemistry needs to be directed such that it contacts the flux 102 that is located at the bottom of the stack, at the middle of the stack and at the top of the stack. The angled nature of the nozzle device allows for the chemistry to be discharged at the sides of the stack where the flux 102 is located. This desired spray pattern is achieved by the angled nozzle device 10 described herein and by moving the angled nozzle 10 linearly. In particular, the angled nozzle device 10 can moved laterally in a direction toward and away from the die stack. In FIG. 4, the nozzle device 10 is shown in a first position (labeled "A") and is shown moved to a second position (labeled "B") as by moving the nozzle device 10 horizontally (linearly). It will be understood that such movement of the angled nozzle device 10 causes a change in the spray coverage of the spray nozzle device 10. For example, when the angled spray nozzle 10 is located closest to the die stack, the spray coverage is primarily at the top of the stack and therefore, the flux 102 in this region is directly in contact with the discharged chemistry. As the spray nozzle device 10 is moved in a direction away from the stack, the spray coverage moves downward in that the flux 102 that is located between the middle dies is contacted by the chemistry for removal thereof. Finally, when the spray nozzle device 10 is located furthest away from the stack, the spray coverage is at the bottom of the stack to thereby remove flux 102 located between the bottom dies. The ability to linearly move the spray nozzle device 10 allows the spray coverage to be altered and in particular, allows the chemistry to be directed to different flux regions along the height of the stack.

It is to be understood that the figures and descriptions of the present invention have been simplified to illustrate elements that are relevant for a clear understanding of the present invention, while eliminating, for the purposes of clarity, many other elements which may be found in the present invention. Those of ordinary skill in the pertinent art will recognize that other elements are desirable and/or required in order to implement the present invention. However, because such elements are well known in the art, and because such elements do not facilitate a better understanding of the present invention, a discussion of such elements is not provided herein.

What is claimed is:

1. A method for treating a substrate that has openings formed therein, comprising the steps of:
   wetting the substrate with a first fluid by positioning the substrate within a first immersion bath for filling the openings in the substrate with the first fluid; and
   spraying the wetted substrate with a spray nozzle device that discharges a second fluid, wherein the spray nozzle device is configured such that a spray nozzle arm thereof is formed at an angle less than 45 degrees relative to a reference plane for discharging the second fluid towards the openings in the wetted substrate, wherein the reference plane is parallel to a ground surface.

2. The method of claim 1, further including the steps of:
   rinsing the sprayed substrate with a third fluid;
   immersing the rinsed substrate in a fourth fluid contained in a second immersion bath; and
   spin drying the substrate after removal of the substrate from the second immersion bath.

3. The method of claim 2, wherein the third fluid comprises a low clean surface tension fluid.

4. The method of claim 2, wherein the third fluid and the fourth fluid are the same.

5. The method of claim 2, wherein the step of spin drying the substrate comprises emitting N2 gas that is oriented toward the substrate for drying the substrate.

6. The method of claim 2, further including an optional hot plate\N2 purge for drying the substrate.

7. The method of claim 1, wherein the spray nozzle arm is formed at an angle of 30 degrees relative to the horizontal reference plane.

8. The method of claim 1, wherein the substrate comprises at least two dies, each die having a plurality of interconnect devices along with flux between adjacent dies.

9. The method of claim 8, wherein the interconnect devices comprises at least one of: pillars, solder bumps, and metal pads.

10. The method of claim 8, wherein each of the first fluid and the second fluid is selected to remove the flux.

11. The method of claim 8, wherein the substrate comprises a stack of 4 or more dies, each die having a plurality of interconnect devices along with flux between adjacent dies.

12. The method of claim 1, wherein the spray nozzle device is disposed laterally from the substrate and the spray nozzle device is configured to laterally move in a direction toward the substrate and laterally away from the substrate.

13. The method of claim 1, wherein the openings have a size of 20 microns or less.

14. The method of claim 1, wherein the spray nozzle device is located at a spin station that is configured to receive the wetted substrate, the spray nozzle device being configured to operate in both: (1) a first mode that is a high pressure mode in which the second fluid is discharged at high pressure up to 3000 psi and (2) a second mode that is a low pressure mode in which the second fluid is discharged at low pressure up to 60 psi.

15. The method of claim 1, further including the step of:
   spinning the substrate; and
   operating the spray nozzle device in arm scan mode in which the spray nozzle device moves across the substrate from one edge of the substrate to an opposite edge of the substrate and reversing a spin direction of the substrate.

16. The method of claim 15, wherein an RPM value of the spinning substrate is varied and the spray nozzle device is operated at a lower pressure that is less than 60 psi and a high volume that is greater than 1 LPM.

17. A system for removing flux from openings formed in a substrate that has openings formed therein comprising:
   a spray nozzle device that has a spray nozzle arm that is formed at an angle of less than 45 degrees relative to a horizontal reference plane for discharging fluid towards the openings in the substrate for flux removal, wherein the reference plane is parallel to a ground surface.

18. The system of claim 17, wherein the angle is 30 degrees.

19. The system of claim 17, wherein the spray nozzle device is configured to move linearly in a direction towards and away from the substrate.

20. The system of claim 17, wherein the spray nozzle device is located at a spin station that is configured to receive the wetted substrate, the spray nozzle device being configured to operate in both: (1) a first mode that is a high pressure mode in which the fluid is discharged at high pressure up to 3000 psi and (2) a second mode that is a low pressure mode in which the fluid is discharged at low pressure up to 60 psi.

\* \* \* \* \*